US012677506B2

(12) United States Patent
Chen et al.

(10) Patent No.: US 12,677,506 B2
(45) Date of Patent: Jul. 7, 2026

(54) ULTRAVIOLET LIGHT EMITTING DIODE AND MANUFACTURING METHOD THEREFOR

(71) Applicant: Xiamen San'an Optoelectronics Co., Ltd., Xiamen (CN)

(72) Inventors: Gong Chen, Xiamen (CN); Yashu Zang, Xiamen (CN); Jianbin Chen, Xiamen (CN); Bin Jiang, Xiamen (CN); Chung-Ying Chang, Xiamen (CN); Shao-Hua Huang, Xiamen (CN)

(73) Assignee: Xiamen San'an Optoelectronics Co., Ltd., Xiamen (CN)

( * ) Notice: Subject to any disclaimer, the term of this patent is extended or adjusted under 35 U.S.C. 154(b) by 378 days.

(21) Appl. No.: 18/415,648

(22) Filed: Jan. 18, 2024

(65) Prior Publication Data

US 2024/0243227 A1 Jul. 18, 2024

(30) Foreign Application Priority Data

Jan. 18, 2023 (CN) .......................... 202310078573.5

(51) Int. Cl.
| | |
|---|---|
| *H10H 20/819* | (2025.01) |
| *B23K 26/073* | (2006.01) |
| *H10H 20/01* | (2025.01) |
| *H10P 54/00* | (2026.01) |

(52) U.S. Cl.
CPC ....... *H10H 20/819* (2025.01); *B23K 26/0734* (2013.01); *B23K 26/0736* (2013.01); *H10H 20/01* (2025.01); *H10P 54/00* (2026.01)

(58) Field of Classification Search
CPC .. H10P 54/20; B23K 26/0734; B23K 26/0738
See application file for complete search history.

(56) References Cited

U.S. PATENT DOCUMENTS

2016/0181489 A1* 6/2016 Matsui ................... H10H 20/82
438/29

* cited by examiner

*Primary Examiner* — Amar Movva
(74) *Attorney, Agent, or Firm* — Hemisphere Law, PLLC

(57) ABSTRACT

Provided are an ultraviolet light emitting diode (LED) and a manufacturing method thereof. The manufacturing method includes: providing an LED wafer including a substrate and a semiconductor stacked layer, the semiconductor stacked layer has a lower surface and an upper surface, the semiconductor stacked layer includes a first semiconductor layer, a light emitting layer and a second semiconductor layer; focusing a first laser beam and a second laser beam into the substrate, a focusing position of the first laser beam is closer to the lower surface than that of the second laser beam, the first laser beam is focused to form at least one first laser cutting line, laser scratches of each first laser cutting line are quasi-circular, and the at least one first laser cutting line includes a laser cutting line closest to the lower surface; and separating the LED wafer to form LED chips.

20 Claims, 8 Drawing Sheets

ULTRAVIOLET LIGHT EMITTING DIODE AND MANUFACTURING METHOD THEREFOR

TECHNICAL FIELD

The present disclosure relates to the field of semiconductor manufacturing technologies, and particularly to an ultraviolet light emitting diode and a manufacturing method therefor.

BACKGROUND

A light emitting diode (LED) is a semiconductor light emitting element, usually made of semiconductors such as gallium nitride (GaN), gallium arsenide (GaAs), gallium phosphide (GaP) and gallium arsenide phosphide (GaAsP), and a core of the LED is a PN junction with light-emitting characteristics. The LED has the advantages of higher luminous intensity, higher efficiency, smaller volume, and longer service life, and is considered as one of the most potential light sources at present.

In recent years, a great application value of an ultraviolet LED (UV-LED), especially a deep ultraviolet LED, has attracted great attention and become a new research hotspot. The UV-LED is a solid-state semiconductor device that can directly convert electric energy into ultraviolet light. With the development of technology, the UV-LED has broad market application prospects in the fields of biomedicine, anti-counterfeiting identification, purification (water, air, and the like), computer data storage, and military affairs.

In a manufacturing process of LED chips, a series of laser scratches are usually formed in a sapphire substrate of an LED wafer by laser stealth dicing, and then the LED wafer is cut by splitting to form the LED chips. In order to achieve higher brightness of a UV-LED chip, the chip will need a thicker sapphire substrate to enhance light extraction. However, with the thickening of the sapphire substrate, it is necessary to increase process parameters such as a power, a cutter depth and a cutter number of the laser stealth dicing in a dicing process of the manufacturing process of the chip. With the increasing of these process parameters, the impact and damage of the laser stealth dicing on an epitaxial light emitting layer are also increasing. An epitaxial light emitting layer of a blue LED is an indium gallium nitride (InGaN) system, which has a lower relative stress; and a bottom layer of the epitaxial light emitting layer is usually a GaN layer, and a thermal expansion coefficient of the GaN layer is smaller. When the laser stealth dicing is applied to the sapphire substrate of the blue LED, part of a high-energy heat makes the sapphire substrate explode, and the remaining high-energy heat will continue to diffuse towards the epitaxial light emitting layer until it is dissipated. Further, an epitaxial light emitting layer of the UV-LED is an aluminum gallium nitride (AlGaN) system, which has a larger overall stress, and a bottom layer of epitaxial light emitting layer is usually an aluminum nitride (AlN) layer with a larger thermal expansion coefficient, which makes the epitaxial light emitting layer of the UV-LED of the AlGaN system relatively more sensitive to heat and prone to generate micro-cracks and leakage channels. Therefore, in order not to damage the epitaxial light emitting layer, laser stealth dicing scratches need to be farther away from the epitaxial light emitting layer, which makes the thickness of the substrate increase, and thus leads to poor splitting yield. At present, it is known that the shortest spacing between laser scratches after the laser stealth dicing and a semiconductor stacked layer of the existing UV-LED is about 130 micrometers (μm), and experiments show that when the spacing is reduced to about 100 μm, the splitting yield will decrease. Therefore, how to shorten the spacing between the laser scratches and the semiconductor stacked layer while maintaining the splitting yield to thereby achieve the effect of further improving the brightness of the UV-LED is one of the technical problems that need to be solved urgently by technicians in this field.

SUMMARY

An embodiment of the present disclosure provides a manufacturing method for a UV-LED, including: providing an LED wafer including a substrate and a semiconductor stacked layer disposed on a surface of the substrate, the semiconductor stacked layer has a lower surface facing towards the surface of the substrate and an upper surface opposite to the lower surface, the semiconductor stacked layer includes a first semiconductor layer, a light emitting layer and a second semiconductor layer arranged sequentially in that order in a direction from the lower surface to the upper surface; providing and focusing laser beams including a first laser beam and a second laser beam into the substrate, a focusing position of the first laser beam is closer to the lower surface of the semiconductor stacked layer than a focusing position of the second laser beam, the first laser beam is focused into the substrate to form at least one first laser cutting line, laser scratches of each of the at least one first laser cutting line are quasi-circular, and the at least one first laser cutting line includes a laser cutting line closest to the lower surface of the semiconductor stacked layer; and separating the LED wafer to form LED chips.

In some embodiments, each of the quasi-circular laser scratches has a longer axis and a shorter axis, and a ratio of the shorter axis to the longer axis is less than or equal to 1:1.5.

In some embodiments, the at least one first laser cutting line is X in number, and X is greater than or equal to 2.

In some embodiments, a spacing between the focusing position of the first laser beam and the lower surface of the semiconductor stacked layer is greater than or equal to 30 micrometers (μm), and less than or equal to 130 μm.

In some embodiments, the second laser beam is focused into the substrate to form at least one second laser cutting line, the at least one second laser cutting line is Y in number, and Y is greater than or equal to 1.

In some embodiments, a spacing between the focusing position of the second laser beam and the lower surface of the semiconductor stacked layer is greater than or equal to 100 μm, and less than or equal to 210 μm.

An embodiment of the present disclosure provides an ultraviolet light emitting diode, which includes a substrate and a semiconductor stacked layer disposed on a surface of the substrate; the semiconductor stacked layer has a lower surface facing towards the surface of the substrate and an upper surface opposite to the lower surface; the semiconductor stacked layer includes a first semiconductor layer, a light emitting layer and a second semiconductor layer arranged sequentially in that order in a direction from the lower surface to the upper surface; at least one first laser cutting line formed by a first laser beam and at least one second laser cutting line formed by a second laser beam are disposed in the substrate, one first laser cutting line of the at least one first laser cutting line is closer to the lower surface of the semiconductor stacked layer than each of the at least one second laser cutting line, and laser scratches of each of the at least one first laser cutting line are quasi-circular.

In some embodiments, the at least one first laser cutting line is X in number, the at least one second laser cutting line is Y in number, X is greater than or equal to 2, and Y is greater than or equal to 1.

In some embodiments, a spacing between each of the at least one first laser cutting line and the lower surface of the semiconductor stacked layer is greater than or equal to 30 µm, and less than or equal to 130 µm.

In some embodiments, a spacing between each of the at least one second laser cutting line and the lower surface of the semiconductor stacked layer is greater than or equal to 100 µm, and less than or equal to 210 µm.

In some embodiments, the laser scratches of each of the at least one first laser cutting line are separated from each other, that is to say, the laser scratches are not discontinuous and not in contact with each other.

In some embodiments, the laser scratches of each of the at least one first laser cutting line are uniformly distributed in a horizontal direction of the substrate, and a spacing between each two adjacent laser scratches of the laser scratches of each of the at least one first laser cutting line in the horizontal direction of the substrate is in a range from 1 µm to 16 µm.

In some embodiments, laser scratches of each of the at least one second laser cutting line are uniformly distributed in a horizontal direction of the substrate, and a spacing between each two adjacent laser scratches of the laser scratches of each of the at least one second laser cutting line in the horizontal direction of the substrate is in a range from 2 µm to 18 µm.

In some embodiments, the at least one first laser cutting line includes at least three first laser cutting lines arranged in parallel, and spacings among the at least three first laser cutting lines in a vertical direction of the substrate are uniformly arranged or gradually changed.

In some embodiments, in a direction facing away from the lower surface of the semiconductor stacked layer, a spacing between each two adjacent first laser cutting lines of the at least three first laser cutting lines in the vertical direction of the substrate gradually increases.

In some embodiments, a spacing between each two adjacent first laser cutting lines of the at least three first laser cutting lines is in a range from 5 µm to 25 µm.

In some embodiments, the at least one second laser cutting line includes at least two second laser cutting lines arranged in parallel, and a spacing of each two adjacent second laser cutting lines of the at least two second laser cutting lines in a vertical direction of the substrate is in a range from 35 µm to 100 µm.

In some embodiments, a thickness of the substrate is greater than or equal to 270 µm.

In some embodiments, laser scratches of each of the at least one second laser cutting line are elongated strips in shape.

In some embodiments, a sum of areas of the laser scratches of the at least one first laser cutting line on a side surface of the substrate and areas of laser scratches of the at least one second laser cutting line on the side surface of the substrate is more than 20% of an area of the side surface of the substrate.

An embodiment of the present disclosure provides an ultraviolet light emitting device, which includes any one ultraviolet light emitting diode described in any one of the above embodiments.

Compared with the related art, the present disclosure has at least the following beneficial effects.

The present disclosure provides the ultraviolet light emitting diodes and the manufacturing method therefor, in which firstly, by setting the laser scratches of the first laser cutting line close to the semiconductor stacked layer as quasi-circular explosion points to replace the existing elongated strip explosion points, an incident angle of each quasi-circular explosion point is close to 90 degrees, and most light rays can be directly emitted from the quasi-circular explosion point, so that the quasi-circular explosion point is more conducive to light emission and can increase light emission; and secondly, by replacing a single high-energy first laser cutting line close to the semiconductor stacked layer with several low-energy first laser cutting lines, the spacing between the laser stealth dicing scratch and the semiconductor stacked layer is shortened. With the ultraviolet light emitting diodes and the manufacturing method therefor of the present disclosure, a problem of poor splitting yield is effectively solved; the closer the laser stealth dicing scratch is to the semiconductor stacked layer, the smaller an incident angle of light is, which is more conducive to the exit of light close to an active layer and increases the light extraction; and the number of laser scratches on a side surface of the chip is increased and thus the roughness of the side surface is increased. As such, the brightness of the chip can be improved while maintaining the yield of the chip.

BRIEF DESCRIPTION OF DRAWINGS

FIG. 3A illustrates the optical path of the quasi-circular laser scratch and FIG. 3B illustrates the optical path of the elongated strip laser scratch.

REFERENCE NUMERALS

110—substrate; 120—semiconductor stacked layer; 121—first semiconductor layer; 122—light emitting layer;

123—second semiconductor layer; 124—upper surface; 125—lower surface; 131—first contact electrode; 132—second contact electrode; 141—first pad electrode; 142—second pad electrode; 150—insulating layer; 100—first laser cutting line; 200—second laser cutting line; 101—first cutting line; 102—second cutting line; D1—first height.

DETAILED DESCRIPTION OF EMBODIMENTS

The present disclosure provides a manufacturing method for a UV-LED and the UV-LED manufactured by the manufacturing method. At least one first laser cutting line with lower energy is arranged, laser scratches of the at least one first laser cutting line are quasi-circular explosion points, and the laser scratches are further close to the semiconductor stacked layer, as such, the brightness of the corresponding chips is effectively improved while maintaining the yield of the corresponding chips.

Embodiment 1

Figure 1:
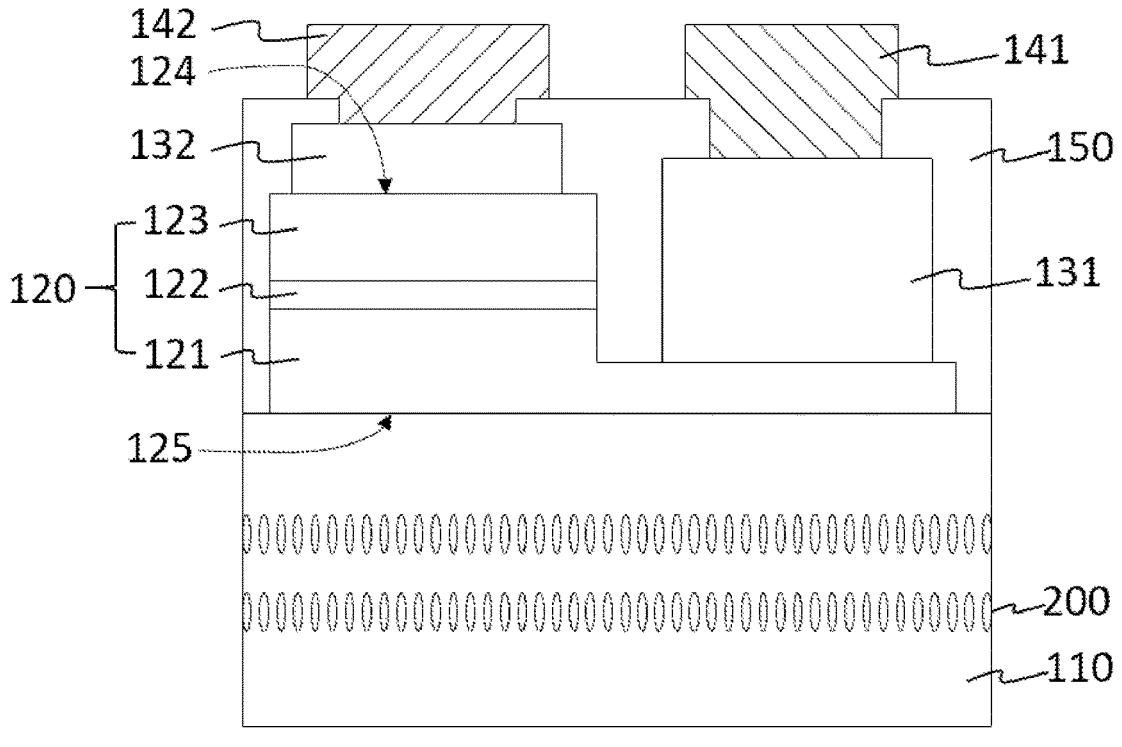
FIG. 1 illustrates a schematic sectional view of a UV-LED chip manufactured by an existing laser stealth dicing process.
Figure 2:
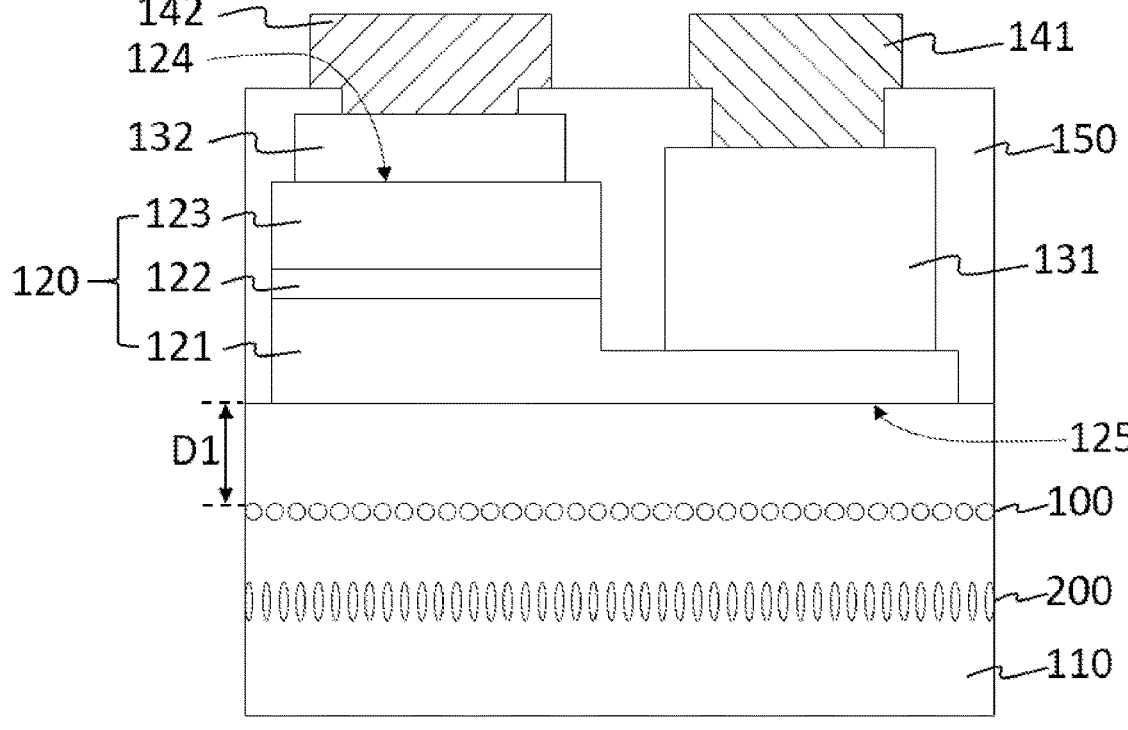
FIG. 2 illustrates a schematic sectional view of a UV-LED chip manufactured by a laser stealth dicing process according to an embodiment of the present disclosure.
Figure 5:
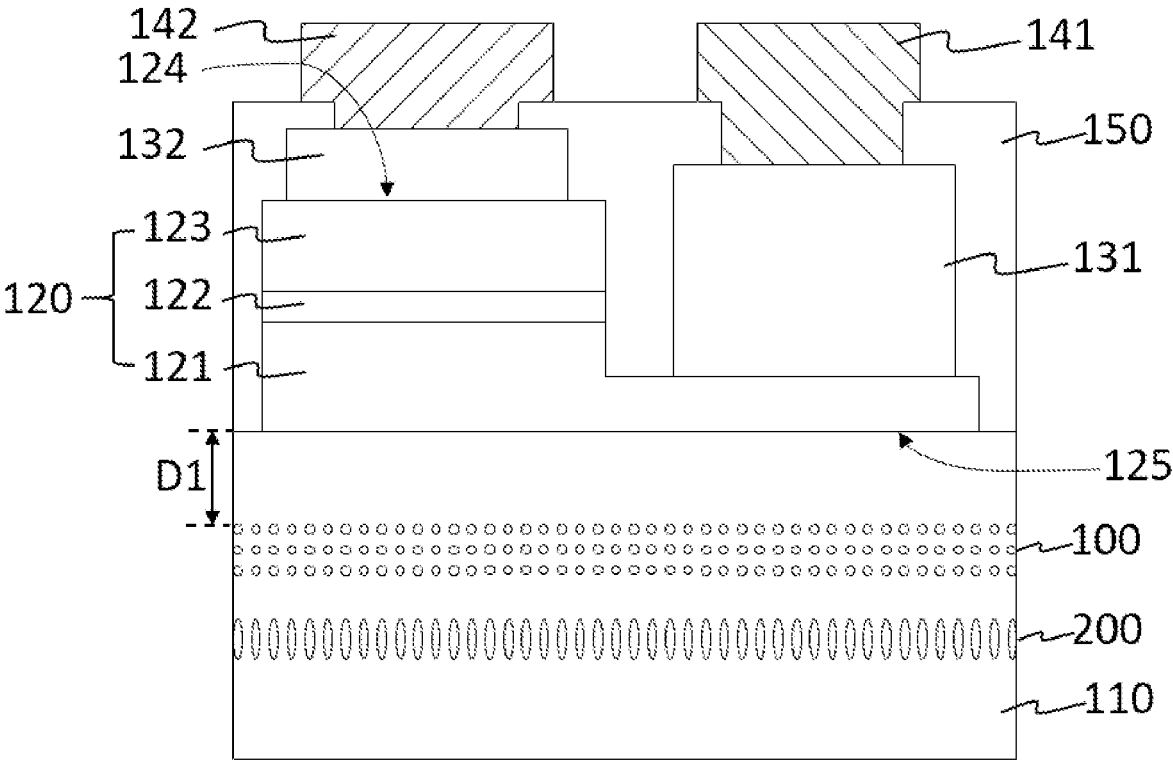
FIG. 5 illustrates a schematic sectional view of another UV-LED chip manufactured by a laser stealth dicing process according to an embodiment of the present disclosure.

FIG. 2 and FIG. 5 illustrate schematic sectional views of different UV-LED chips manufactured by different laser stealth dicing processes according to embodiments of the present disclosure. FIG. 6 through FIG. 13 illustrate schematic structural views of a flowchart of a manufacturing method for the UV-LED chip in FIG. 5, which mainly includes the following steps S110 to S130, which will be described in detail below.

Figure 6:
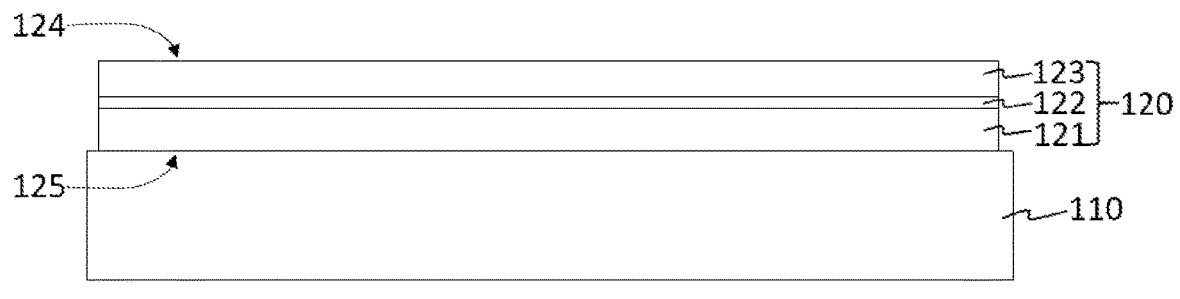
FIG. 6 through FIG. 13 illustrate schematic structural views of a flowchart of a manufacturing method for the UV-LED chip in FIG. 5.

In the step S110, an LED wafer is provided, which includes a substrate 110 and a semiconductor stacked layer 120 disposed on a surface of the substrate 110, as illustrated in FIG. 6. Specifically, the substrate 110 can be made of a transparent or translucent material, the transparent or translucent substrate can allow light radiated by the semiconductor stacked layer 120 to pass through the substrate 110 to reach a side of the substrate 110 facing away from the semiconductor stacked layer 120. In some embodiments, the substrate 110 can be any one of a sapphire flat substrate, a sapphire patterned substrate, a silicon substrate, a silicon carbide substrate, a gallium nitride substrate, and a glass substrate. In some embodiments, the substrate 110 may be a combined patterned substrate, and patterns of the substrate 110 are a series of convex structures. Each convex structure may be a one-layer structure or a multi-layer structure and may include at least one light extraction layer with a refractive index lower than that of the substrate 110, and a thickness of the light extraction layer is greater than half of a height of the convex structure, which is more conducive to the light extraction efficiency of the UV-LED. In some embodiments, the convex structure is a bullet-like structure, and a material of the light extraction layer may be a material whose refractive index is less than 1.6, such as silicon dioxide. In some embodiments, the substrate 110 may be thinned or removed to form a thin-film chip.

The semiconductor stacked layer 120 has a lower surface 125 facing towards the surface of substrate 110 and an upper surface 124 opposite to the lower surface 125. The semiconductor stacked layer 120 includes a first semiconductor layer 121, a light emitting layer 122 and a second semiconductor layer 123 sequentially arranged in that order in a direction from the lower surface 125 to the upper surface 124.

The first semiconductor layer 121 is formed on the substrate 110. The first semiconductor layer 121 may be an N-type semiconductor layer and can provide electrons to the light-emitting layer 122 under the action of a power supply.

In some embodiments, the first semiconductor layer 121 includes an N-type doped nitride layer. The N-type doped nitride layer may include an N-type impurity of one or more group IV elements. The N-type impurity may include one or a combination of silicon (Si), germanium (Ge) and tin (Sn). In an embodiment, the first semiconductor layer 121 is doped with aluminum (A1) to facilitate the UV-LED to emit ultraviolet light. In some embodiments, a buffer layer may be further disposed between the first semiconductor layer 121 and the substrate 110 to reduce the lattice mismatch between the substrate 110 and the first semiconductor layer 121, that is, the N-type semiconductor layer. The buffer layer may include an unintentionally doped AlN layer (un-doped AlN, abbreviated as u-AlN) or an unintentionally doped AlGaN layer (un-doped AlGaN, abbreviated as u-AlGaN). In other embodiments, the first semiconductor layer 121 may also be connected to the substrate 110 through an adhesive layer.

The light emitting layer 122 may be a quantum well (QW). In some embodiments, the light emitting layer 122 may also be a multiple quantum well (MQW), and the multiple quantum well includes multiple quantum well layers and multiple quantum barrier layers alternately arranged in a repetitive manner, such as GaN/AlGaN, InAlGaN/InAlGaN or InGaN/AlGaN. In addition, a composition and a thickness of the quantum well layer in the light emitting layer 122 determine a wavelength of generated light. In order to improve the luminous efficiency of the light emitting layer 122, a depth of the quantum well layer of the light emitting layer 122, and a layer number, a thickness and/or other characteristics of paired quantum well layer and quantum barrier layer of the light emitting layer 122 can be changed. In particular, by adjusting the composition of the quantum well layer, the light emitting layer 122 that generates different colors of light such as ultraviolet light, blue light and green light can be provided. In an embodiment, a wavelength of light emitted from the UV-LED is in a range from 200 nanometers (nm) to 420 nm, that is to say, a wavelength of light emitted from the light emitting layer 122 is in a range from 200 nm to 420 nm.

The second semiconductor layer 123 may be a P-type semiconductor layer, and can provide holes to the light emitting layer 122 under the action of a power supply. In some embodiments, the second semiconductor layer 123 includes a P-type doped nitride layer. The P-type doped nitride layer may include a P-type impurity of one or more group II elements. The P-type impurity may include one or a combination of magnesium (Mg), zinc (Zn) and beryllium (Be).

Although the first semiconductor layer 121 and the second semiconductor layer 123 in drawings of the disclosure each have a single-layer structure, the present disclosure is not limited to this, and each of the first semiconductor layer 121 and the second semiconductor layer 123 may be a multi-layer structure with different compositions, and may also include a superlattice layer. In addition, the arrangement of the semiconductor stacked layer 120 is not limited to this, and other types of semiconductor stacked layers 120 may be selected according to actual needs. For example, in other embodiments, when the first semiconductor layer 121 is doped with a P-type impurity, the second semiconductor layer 123 may be doped with an N-type impurity, that is, the first semiconductor layer 121 is a P-type semiconductor layer and the second semiconductor layer 123 is an N-type semiconductor layer.

Figure 7:
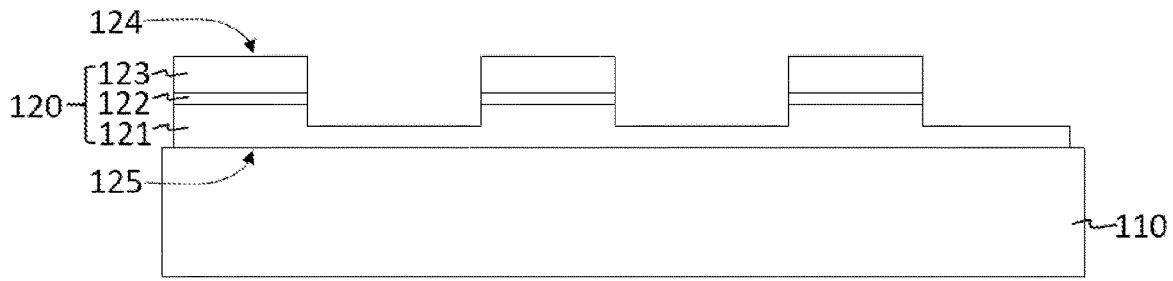

Next, as illustrated in FIG. 7, parts of the second semiconductor layer 123 and the light emitting layer 122 are removed by an etching process, and the first semiconductor layer 121 is exposed.

Figure 8:
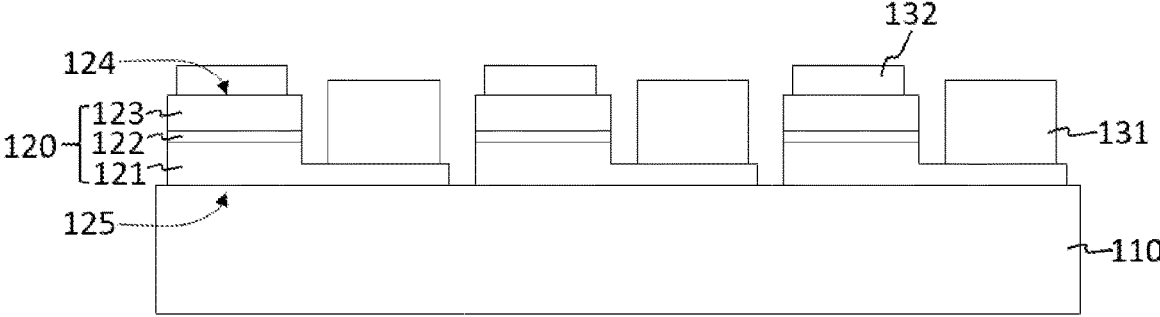

Next, as illustrated in FIG. 8, a current blocking layer (not shown), a current diffusion layer (not shown), first contact electrodes 131 and second contact electrodes 132 are formed on the semiconductor stacked layer 120.

The first contact electrodes 131 are in direct contact with the first semiconductor layer 121, and each of the first contact electrodes 131 is selected from one or more of chromium (Cr), platinum (Pt), gold (Au), nickel (Ni), titanium (Ti) and Al. Because the first semiconductor layer 121 has a higher Al composition, the first contact electrode 131 needs to be fused at a higher temperature to form an alloy after being deposited on a mesa, so as to form a good ohmic contact with the first semiconductor layer 121. The first contact electrode 131 can be a single layer, a double layer or a multi-layer structure, such as Ti/Al, Ti/Al/Au, Ti/Al/Ni/Au and Cr/Al/Au.

The second contact electrodes 132 are in direct contact with the second semiconductor layer 123. Each of the second contact electrodes 132 may be made of an oxide transparent conductive material or a metal material, for example, a metal alloy such as NiAu, NiAg, and NiRh. In an embodiment, a thickness of the second contact electrode 132 is below 30 nm, so as to reduce the light absorption rate of this layer (i.e., the second contact electrodes 132) as much as possible. In an embodiment, a wavelength of light emitted from the light emitting layer 122 is below 280 nm, and each second contact electrode 132 is made of ITO with a thickness of 5-20 nm, for example, 10-15 nm. In this case, an absorption rate of the ITO layer for the light emitted from the light emitting layer 122 can be reduced to less than 40%.

Figure 9:
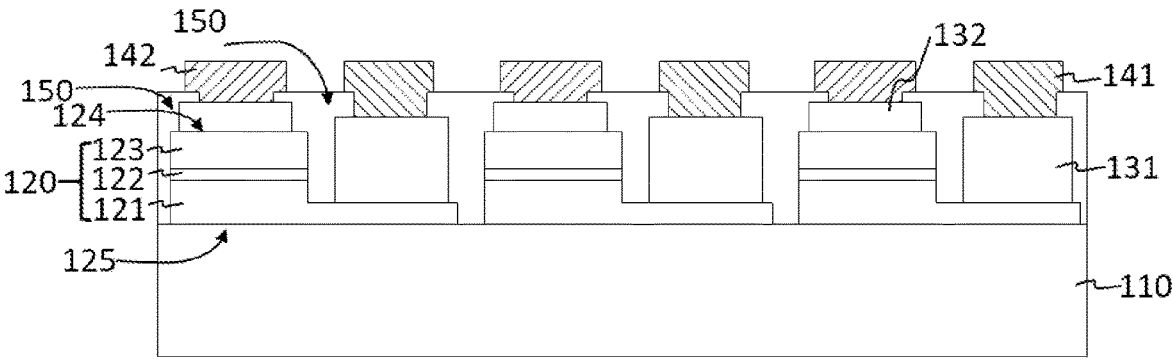

As illustrated in FIG. 9, an insulating layer 150 is covered on the first and second contact electrodes, and on the upper surface 124 and a sidewall of the exposed semiconductor stacked layer 120. A conventional deposition technique such as evaporation or sputtering often results that a thickness of the insulating layer 150 on the sidewall of the semiconductor stacked layer 120 is lower than a thickness of the insulating layer 150 on the upper surface 124 of the semiconductor stacked layer 120 and is lower than a thickness of the insulating layer 150 on an upper surface of the substrate 110 due to a shadowing effect, and results that the thickness of the insulating layer 150 on the sidewall of the semiconductor stacked layer 120 is 40% to 90% of the thickness of the insulating layer 150 on the upper surface 124 of the semiconductor stacked layer 120. The insulating layer 150 has openings for exposing the first contact electrodes 131 and the second contact electrodes 132. A material of the insulating layer 150 includes a non-conductive material, which may be an inorganic material or a dielectric material. The inorganic material may include silicone or glass, and the dielectric material includes aluminum oxide, silicon nitride, silicon dioxide, titanium oxide, or magnesium fluoride. For example, the insulating layer 150 may be silicon dioxide, silicon nitride, titanium oxide, tantalum oxide, niobium oxide, barium titanate, or a combination thereof, and the combination may for example be a distributed bragg reflector (DBR) formed by repeated stacking of two materials. In some embodiments, the insulating layer 150 is a reflective insulating layer, which can enhance the light extraction efficiency of the UV-LED.

First pad electrodes 141 and second pad electrodes 142 are formed on the insulating layer 150 by using photolithography and evaporation processes. The first pad electrodes 141 are electrically connected to the first contact electrodes 131 through the openings in the insulating layer 150, and the second pad electrodes 142 are electrically connected to the second contact electrodes 132 through the openings in the insulating layer 150. In an embodiment, a minimum horizontal spacing between the first pad electrode 141 and the second pad electrode 142 on the insulating layer 150 is above 5 μm, e.g., it may be in a range from 20 μm to 40 μm, from 40 μm to 60 μm, or from 60 μm to 80 μm. The first pad electrodes 141 and second pad electrodes 142 can be made from combinations of metals such as Cr, Pt, Au, Ti, Ni, and Al. In an embodiment, the first pad electrodes 141 and second pad electrodes 142 each have a multilayer structure with a surface layer composed of Au.

Figure 10:
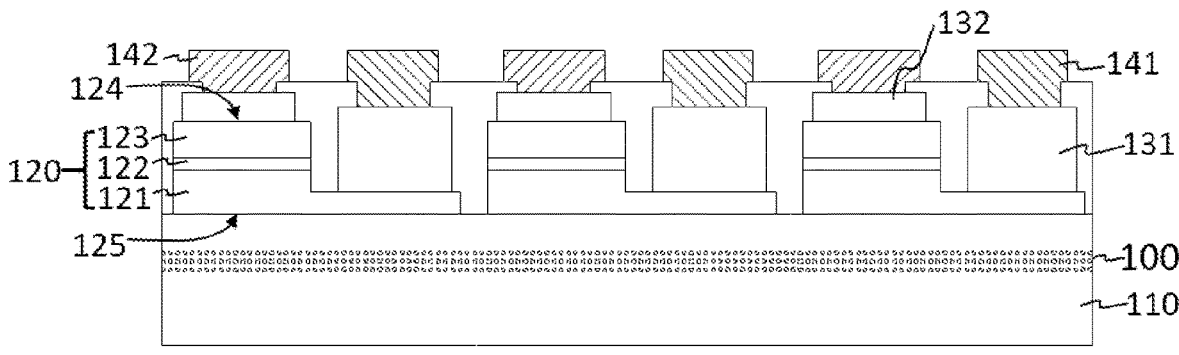
Figure 11:
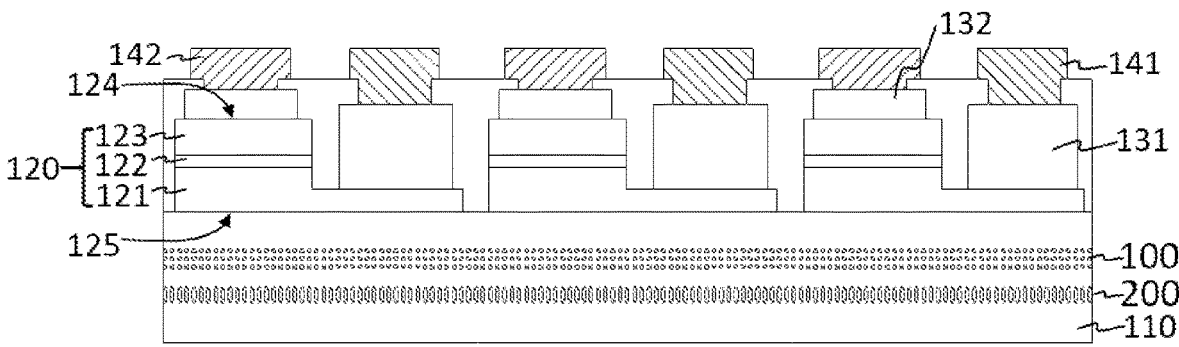

In the step S120, laser beams for irradiating for multiple times are provided and focused into the substrate 110, and the laser beams include a first laser beam and a second laser beam. A focusing position of the first laser beam is closer to the lower surface 125 of the semiconductor stacked layer 120 than a focusing position of the second laser beam. Specifically, the first laser beam with a first pulse energy is used to form at least one first laser cutting line 100 (three rows of first laser cutting lines 100, in FIG. 10) inside the substrate 110, as illustrated in FIG. 10. The second laser beam with a second pulse energy is used to form at least one second laser cutting line 200 (one row of second laser cutting line 200, in FIG. 11) inside the substrate 110, as illustrated in FIG. 11.

Figure 3A:
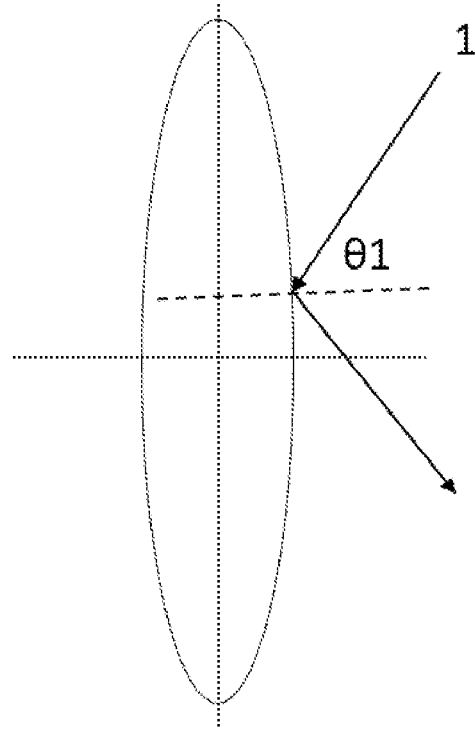
FIG. 3A and FIG. 3B illustrate schematic views of optical paths of a quasi-circular laser scratch and an elongated strip laser scratch.
Figure 3B:
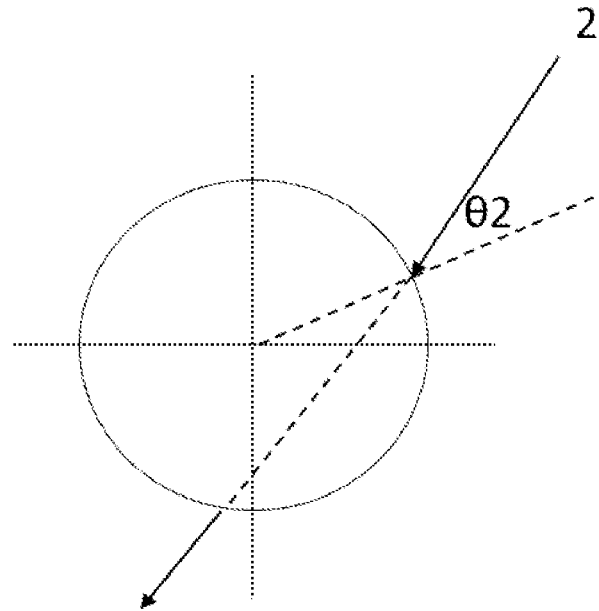
Figure 4A:
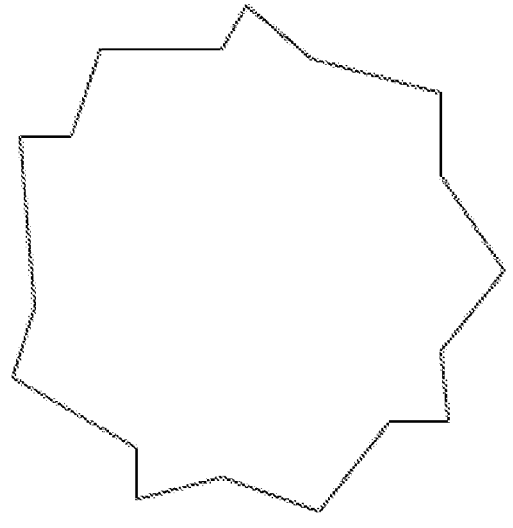
FIG. 4A through FIG. 4C illustrate schematic views of quasi-circular laser scratches according an embodiment of the present disclosure.
Figure 4B:
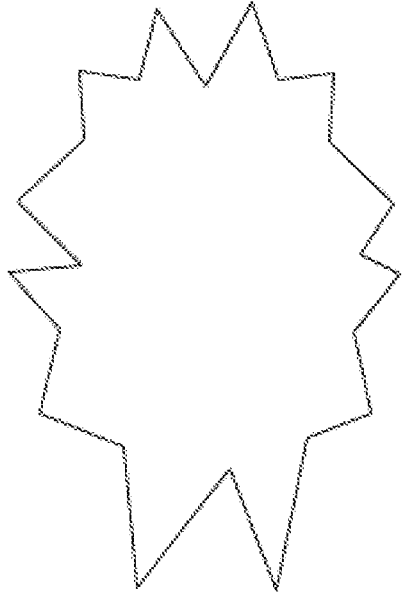
Figure 4C:
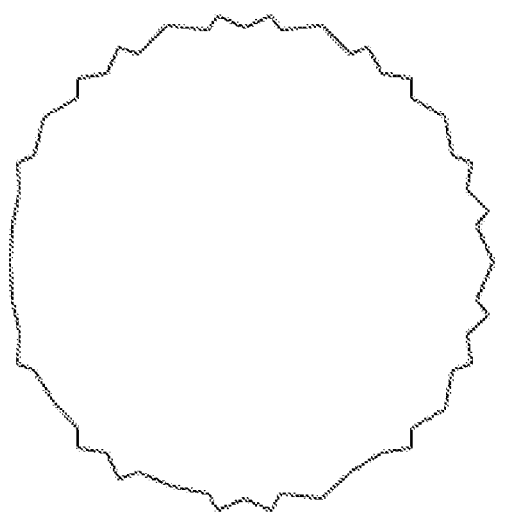

As illustrated in FIG. 2. each laser scratch of the first laser cutting line 100 is a quasi-circular explosion point, and each laser scratch of the second laser cutting line 200 is an elongated strip explosion point. The at least one first laser cutting line 100 includes a laser cutting line closest to the lower surface 125 of the semiconductor stacked layer 120, that is, the laser scratches of the laser cutting line closest to the lower surface 125 of the semiconductor stacked layer 120 are quasi-circular explosion points. As shown in FIG. 3A, light 1 emitted from the light emitting layer 122 is incident on an elongated strip laser scratch, and an incident angle of the light 1 is θ1. When θ1 is greater than a critical angle, the light 1 will be reflected and oscillated inside the LED chip. When the same light 2 emitted from the light emitting layer 122 is incident on a quasi-circular laser scratch, an incident angle of the light 2 is θ2. It is obvious from FIG. 3B that θ1 is greater than θ2, and a probability of θ1 being greater than the critical angle is greater than a probability of θ2 being greater than the critical angle, so the light 1 has a greater probability of total internal reflection than the light 2. Therefore, the quasi-circular laser scratch is more conducive to the emission of light than the elongated strip laser scratch. In addition, the UV-LED chip has more lateral light, and the quasi-circular laser explosion point is helpful for the light to emit and improve the brightness of the UV-LED chip. In the present disclosure, a lighting angle is changed to make the light more uniform. When a side wall of the UV-LED chip has quasi-circular laser scratches, as shown in FIG. 3B, the light 2 will emit from the side wall. It should be noted that the quasi-circular explosion point expressed in the present disclosure is close to a circular explosion point, and is not limited to a completely circular explosion point. Based on the actual process conditions and other factors, it is difficult to make the laser scratches be the same completely circular explosion points, but the explosion points can be relatively uniform in shape and can be close to a circular shape. In some specific embodiments, the quasi-circular explosion point has a longer axis and a shorter axis, and a ratio of the shorter axis to the longer axis is less than or equal to 1:1.5. In some embodiments, the ratio may be in a range from 1:1 to 1:1.3, for example, 1:1, 1:1.1, or 1:1.25. When the ratio is closer to 1:1, it is more likely that the incident angle $\theta2$ on the quasi-circular laser scratch of the light emitted from the light emitting layer 122 will be smaller than the critical angle, and the probability of total internal reflection of the light 2 is smaller, which is more conducive to the light emission. As illustrated in FIG. 4A through FIG. 4C. Examples of quasi-circular explosion points include but are not limited (1) a circular explosion point with a radial/serrated edge, as illustrated in FIG. 4A, (2) an elliptical explosion point with a radial/serrated edge and a ratio of a shorter axis to a longer axis not more than 1:1.5, as illustrated in FIG. 4B, and (3) a circular explosion point with an irregular/uneven edge as illustrated in FIG. 4C, all of which are examples of the quasi-circular explosion points mentioned in the present disclosure. Further, the elongated strip explosion point described in the present disclosure also has a longer axis and a shorter axis, and a ratio of the shorter axis to the longer axis is greater than 1:1.5. In an embodiment, the ratio of the elongated strip explosion point may be in a range from 1:1.5 to 1:2, so that the splitting difficulty is reduced, the light emission is increased, and the brightness of the UV-LED chip is improved.

Further, in some embodiments, as illustrated in FIG. 5, the first laser beam is focused into the substrate in a single-blade multi-focus manner to form X number of first laser cutting lines 100, and the second laser beam is focused into the substrate in a single-blade multi-focus manner to form Y number of second laser cutting line 200, where X≥2 and Y≥1. In the present disclosure, firstly, by replacing a single high-energy first laser cutting line close to the semiconductor stacked layer with several low-energy first laser cutting lines, even if the first pulse energy is increased to a certain extent, the energy of any low-energy first laser cutting line is bound to be lower than that of the single high-energy first laser cutting line, so that the laser scratches are closer to the semiconductor stacked layer, and thus the problem that for the UV-LED of the AlGaN system, which increases a thickness of the substrate in order to improve light extraction, the epitaxial light emitting layer is sensitive to heat, and thus the laser scratches are difficult to get close to the epitaxial layer, which easily leads to poor splitting yield is solved; secondly, the closer the explosion points of laser scratches is to the light emitting layer, the smaller the incident angle of light is, which is more conducive to the exit of light near the light emitting layer and the light extraction is increased; and thirdly, the number of laser scratches on the side surface of the UV-LED chip is increased, the roughness of the side surface is increased, and the brightness of the UV-LED chip is further improved. Specifically, the number X of the first laser cutting lines 100 is greater than or equal to 3, and less than or equal to 5. When there are too many first laser cutting lines 100, if an energy of each first laser cutting line 100 is too low, it will be difficult to split; if the energy of each first laser cutting line 100 is too high, the sum of energy of the first laser cutting lines 100 will be higher and the semiconductor stacked layer 120 will be easily damaged.

Figure 12:
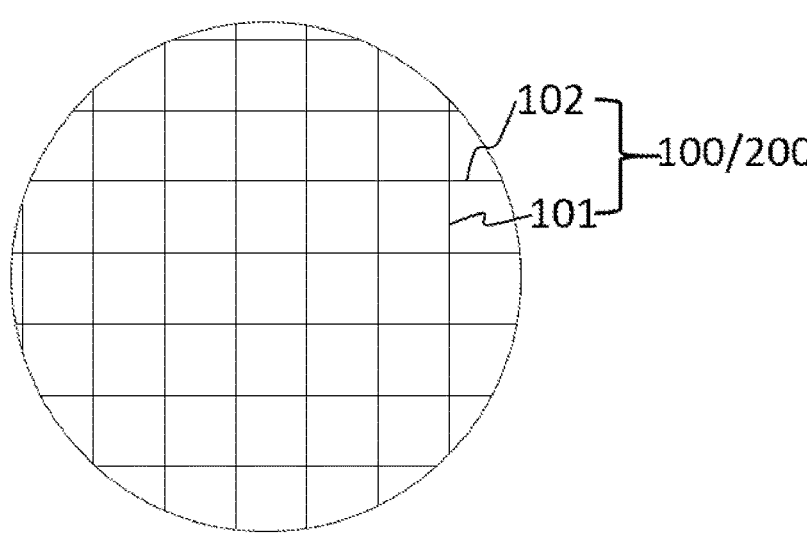

As illustrated in FIG. 12, each laser cutting line 100 or 200 includes multiple first cutting lines 101 and multiple second cutting lines 102, and each first cutting line 101 and each second cutting line 102 may be substantially perpendicular to each other.

In some embodiments, the first pulse energy is not more than 1 watt (w). In some embodiments, the first pulse energy is in a range from 0.3 w to 0.7 w. If the first pulse energy is too small, when the X number of first laser cutting lines 100 are formed, an energy of each first laser cutting line 100 is too low, which will lead to the difficulty of splitting. When the first pulse energy is too large, it is easy to damage the semiconductor stacked layer 120. The second pulse energy is not more than 1 w. In some embodiments, the second pulse energy is in a range from 0.3 w to 0.7 w. The first pulse energy of the first laser beam can be greater than or less than the second pulse energy of the second laser beam. In a situation that the first pulse energy of the first laser beam is less than the second pulse energy of the second laser beam, the first laser cutting lines 100 can be closer to the semiconductor stacked layer 120, so as to further improve the brightness of the UV-LED chip. In a situation that the second pulse energy of the second laser beam is less than the first pulse energy of the first laser beam, the unevenness of a bottom surface of the substrate 110 caused by the excessive energy of the second laser beam is avoided.

In some embodiments, a spacing between the focusing position of the first laser beam and the lower surface 125 of the semiconductor stacked layer 120 is not less than 30 μm and not more than 130 μm. A spacing between the focusing position of the second laser beam and the lower surface of the semiconductor stacked layer 120 is not less than 100 μm and not more than 210 μm. In the present disclosure, several rows of low-energy first laser cutting lines 100 are formed by focusing the first laser beam into the substrate 110, so that the laser scratches are closer to the semiconductor stacked layer 120 and the brightness of the UV-LED chip is improved.

Figure 13:
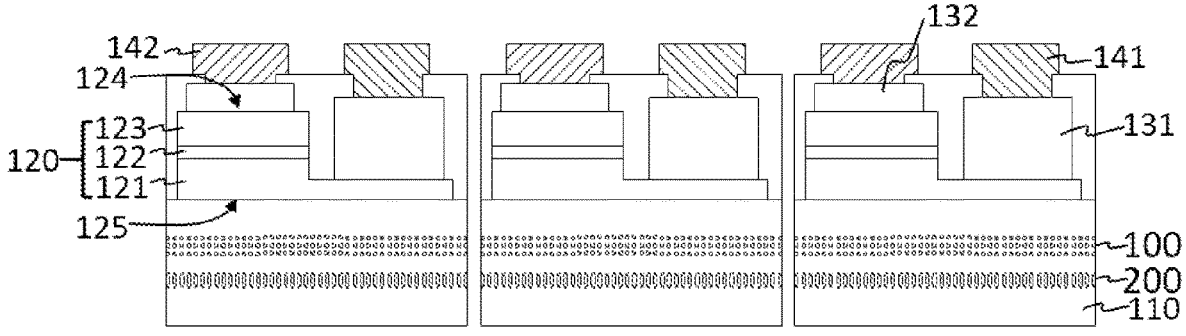

In the step S130, the LED wafer is separated to form several LED chips. As illustrated in FIG. 13, the substrate 110 has X number of first laser cutting lines 100 formed by the first laser beam and Y number of second laser cutting line 200 formed by the second laser beam.

In some embodiments, each first laser cutting line 100 is closer to the lower surface 125 of the semiconductor stacked layer 120 than each second laser cutting line 200, and a spacing between each first laser cutting line 100 and the lower surface 125 of the semiconductor stacked layer 120 is not less than 30 μm and not more than 130 μm. A spacing between each second laser cutting line 200 and the lower surface 125 of the semiconductor stacked layer 120 is not less than 100 μm and not more than 210 μm. A shortest spacing between the first laser cutting line 100 and the lower surface 125 of the semiconductor stacked layer 120 is defined as a first height D1. In some embodiments, when X=1, the first pulse energy of the first laser beam is in a range from 0.4 w to 0.7 w, and the first height D1 is in a range from 120 μm to 130 μm; when X=2, the first pulse energy of the first laser beam is in a range from 0.4 w to 0.72 w, and the first height D1 is in a range from 110 μm to 120 μm; and when X=5, the first pulse energy of the first laser beam is in a range from 0.4 w to 0.75 w, and the first height D1 is in a range from 90 μm to 110 μm.

In some embodiments, the laser scratches are evenly distributed in a horizontal direction of the substrate 110. Specifically, a spacing of each two adjacent laser scratches of the laser scratches of the first laser cutting line 100 in the horizontal direction of the substrate 110 is in a range from 1 μm to 16 μm, and preferably, is in a range from 2 μm to 8 μm. A spacing between each two adjacent laser scratches of laser scratches of the second laser cutting line 200 in the horizontal direction of the substrate 110 is in a range from 2 μm to 18 μm, and preferably, is in a range from 4 μm to 12 μm. Since the laser scratches of the first laser cutting line with low energy and smaller spacing are arranged, difficult splitting is avoided and a splitting yield is improved.

In some embodiments, at least three first laser cutting lines 100 are formed in a single-blade multi-focus manner, and the at least three first laser cutting lines 100 are arranged in parallel, and spacings among the at least three first laser cutting lines 100 in a vertical direction of the substrate 110 are uniformly arranged. A spacing of each two adjacent first laser cutting lines 100 in the vertical direction of the substrate 110 is in a range from 5 μm to 25 μm. In an embodiment, the spacing is in a range from 9 μm to 16 μm. At least two second laser cutting lines 200 are arranged in parallel, and a spacing between two adjacent second laser cutting lines 200 of the at least two second laser cutting lines 200 in the vertical direction of the substrate 110 is in a range 35 μm to 100 μm. Since the laser scratches of the first laser cutting line with low energy and smaller spacing are arranged, difficult splitting is avoided and a splitting yield is improved.

In some embodiments, a thickness of the substrate 110 is not less than 270 μm. In a specific embodiment, when the thickness of the substrate 110 is 300 μm, the first laser cutting lines 100 with the number of two to four, i.e., two to four rows of first laser cutting lines 100 can be formed by focusing the first laser beam into the substrate, for example, three rows of first laser cutting lines 100 and two rows of second laser cutting lines 200 can be formed by focusing the first laser beam into the substrate. In a specific embodiment, when the thickness 110 of the substrate is 400 μm, the first laser cutting lines 100 with the number of three to seven, i.e., three to seven rows of first laser cutting lines 100 can be formed by focusing the first laser beam into the substrate, for example, five rows of first laser cutting lines 100 and three rows of second laser cutting lines 200 can be formed by focusing the first laser beam into the substrate.

In some embodiments, a ratio of a sum of areas (i.e., projection areas of laser scratches on the side surface of the substrate 110) of laser scratches of the at least one first laser cutting line 100 on a side surface of the substrate 110 and areas (i.e., projection areas of laser scratches on the side surface of the substrate 110) of laser scratches of the at least one second laser cutting line 200 on the side surface of the substrate 110 to an area of the side surface of the substrate 110 is more than 20%. In an embodiment, the ratio is in a range from 30% to 60%. When the ratio is too small, it will be difficult to split; when the ratio is too large, it is easy to damage the semiconductor stacked layer 120, and a period of the manufacturing process is too long, thereby wasting productivity.

Embodiment 2

Figure 14:
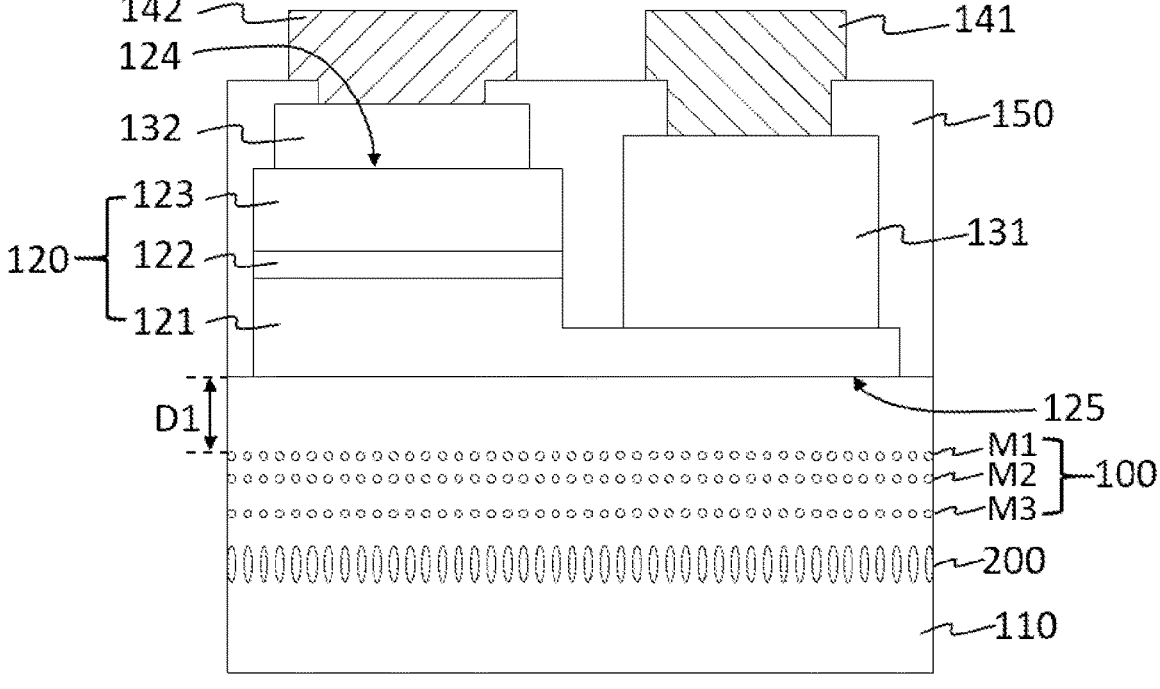
FIG. 14 illustrates a schematic sectional view of still another UV-LED chip manufactured by a laser stealth dicing process according to an embodiment of the present disclosure.

FIG. 14 illustrates a schematic sectional view of still another UV-LED chip manufactured by a laser stealth dicing process of an embodiment of the present disclosure.

In this embodiment, X number of first laser cutting lines 100 (i.e., X rows of first laser cutting lines 100) are formed in a multi-blade and multi-focus manner, where X is more than or equal to 2. The X number of first laser cutting lines 100 are arranged in parallel, and spacings among the X number of first laser cutting lines 100 in the vertical direction of the substrate 110 are gradually changed. Specifically, in a directing facing away from the lower surface 125 of the semiconductor stacked layer 120, the spacing of each two adjacent first laser cutting lines 100 in the vertical direction of the substrate 110 gradually increases, as illustrated in FIG. 14. In a situation that the first laser cutting lines 100 with uniform distributed spacings are M1, M2, M3 in the direction facing away from the lower surface 125 of the semiconductor stacked layer 120, and the first laser cutting lines 100 with increased spacings are M1, M2, M3 in the direction facing away from the lower surface 125 of the semiconductor stacked layer 120, under the energy condition of the same first pulse energy, a spacing between M2 of the first laser cutting lines 100 with increased spacings and the corresponding lower surface 125 is larger than a spacing between M2 of the first laser cutting lines 100 with uniform distributed spacings and the corresponding lower surface 125, and a spacing between M3 of the first laser cutting lines 100 with increased spacings and the corresponding lower surface 125 is larger than a spacing between M3 of the first laser cutting lines 100 with uniform distributed spacings and the corresponding lower surface 125. In this way, the damage degree of M2 and M3 of the first laser cutting lines 100 with increased spacings to the semiconductor stacked layer 120 will be smaller, therefore, a spacing between the first laser cutting line M1 of the first laser cutting lines 100 with increased spacings and the corresponding lower surface 125 can be set closer than a spacing between the first laser cutting line M1 of the first laser cutting lines 100 with uniform distributed spacings and the corresponding lower surface 125, that is to say, the first height D1 corresponding to the first laser cutting lines 100 with increased spacings can be smaller, and the splitting yield of the chip and the brightness of the chip can be further improved to some extent.

Embodiment 3

Figure 15:
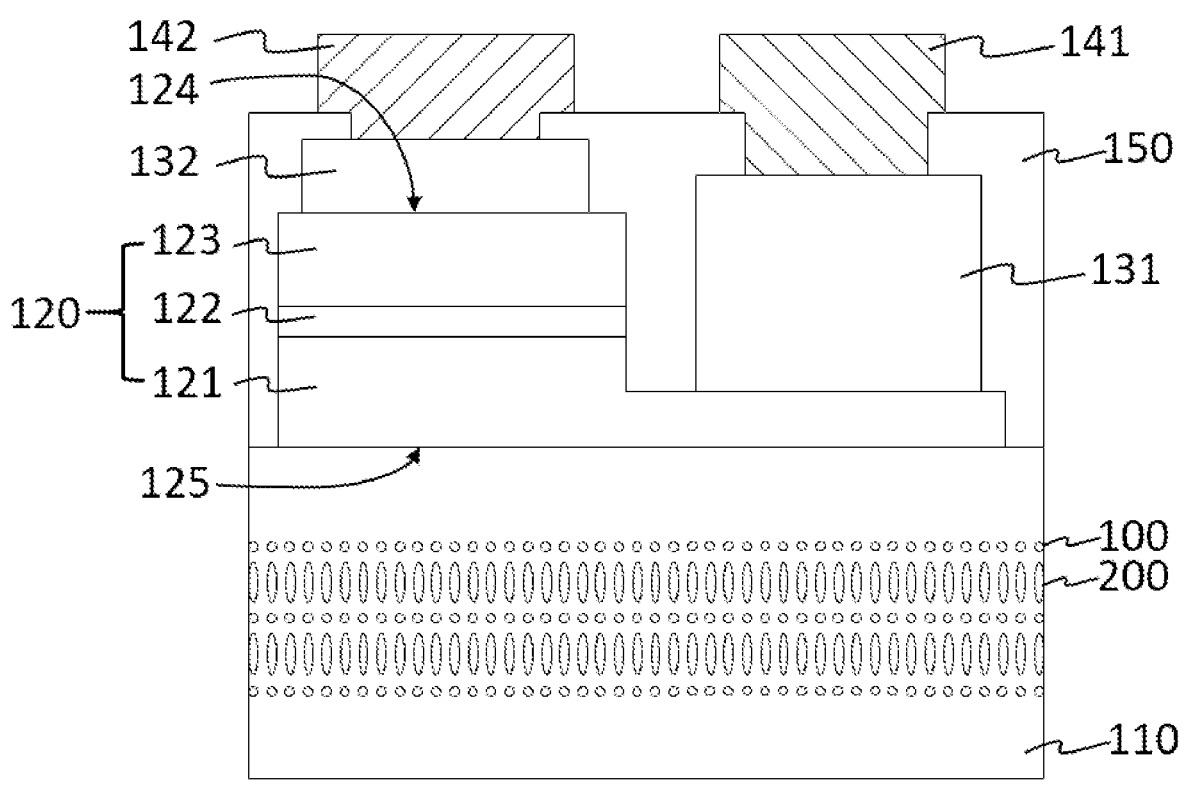
FIG. 15 illustrates a schematic sectional view of yet another UV-LED chip manufactured by a laser stealth dicing process according to an embodiment of the present disclosure.

FIG. 15 illustrates a schematic sectional view of yet another UV-LED chip manufactured by a laser stealth dicing process of an embodiment of the present disclosure.

In this embodiment, X number of first laser cutting lines 100 and Y number of second laser cutting line 200 are formed in a single-blade multi-focus manner or a multi-blade multi-focus manner, where X≥2 and Y≥1. The first and second laser cutting lines are arranged in parallel, and the X number of first laser cutting lines 100 and the Y number of second laser cutting line 200 form a staggered arrangement in the vertical direction of the substrate 110, that is to say, one of the Y number of second laser cutting line 200 is arranged between the X number of first laser cutting liens 100, which enhances the light emission to a certain extent, thereby further improving the brightness of the chip.

Embodiment 4

Figure 16:
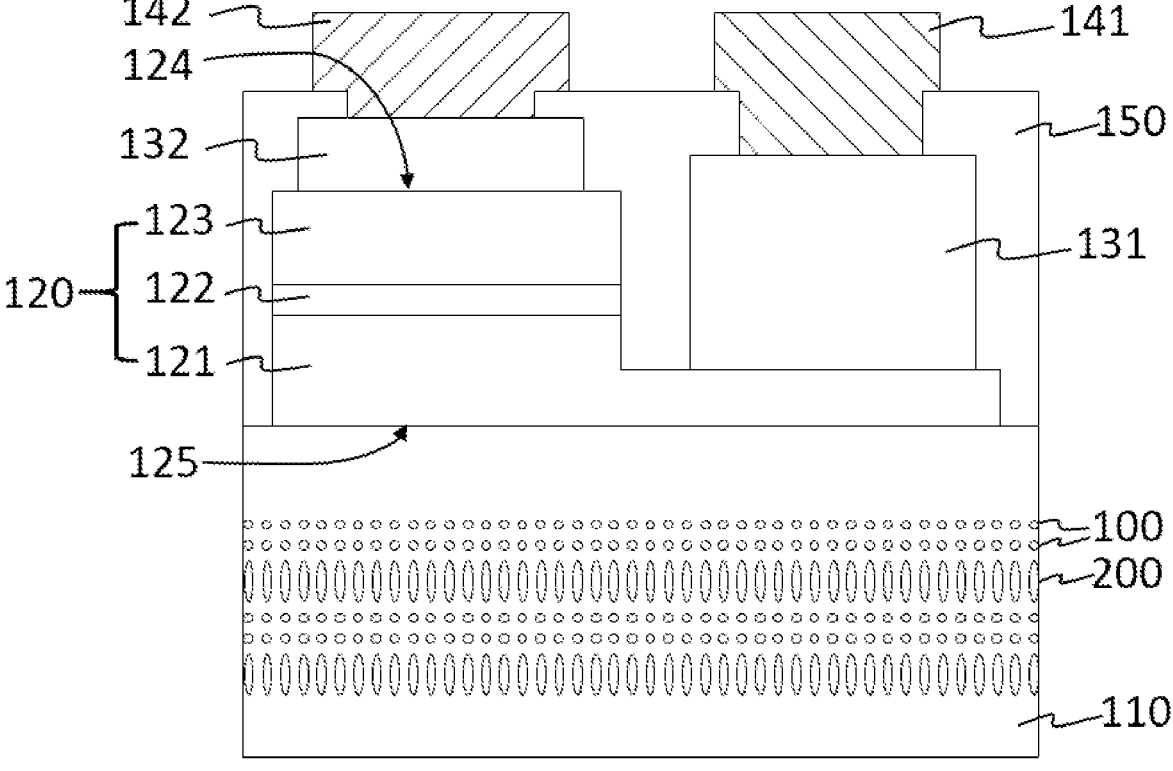
FIG. 16 illustrates a schematic sectional view of yet another UV-LED chip manufactured by a laser stealth dicing process according to an embodiment of the present disclosure.

FIG. 16 illustrates a schematic sectional view of yet another UV-LED chip manufactured by a laser stealth dicing process of an embodiment of the present disclosure.

In this embodiment, X number of first laser cutting lines 100 and Y number of second laser cutting line 200 are formed in a single-blade multi-focus manner or a multi-blade multi-focus manner, where X≥2 and Y≥1. The first and second laser cutting lines are arranged in parallel, and the X number of first laser cutting lines 100 and the Y number of second laser cutting line 200 form a staggered arrangement in the vertical direction of the substrate 110, that is to say, one of the Y number of second laser cutting line 200 is arranged between the X number of first laser cutting liens 100. In this embodiment, a sum of areas (i.e., projection areas of laser scratches on a side surface of the substrate 110) of laser scratches of the X number of first laser cutting lines on a side surface of the substrate 110 is more than one time of a sum of areas (i.e., projection areas of laser scratches on the side surface of the substrate 110) of laser scratches of the Y number of second laser cutting line on the side surface of the substrate 110, that is to say, the sum of the areas of the quasi-circular laser scratches of the X number of first laser cutting lines on the side surface of the substrate 110 is more than one time of the sum of the areas of the elongated strip laser scratches of the Y number of second laser cutting line on the side surface of the substrate 110. In an embodiment, the sum of the areas of the quasi-circular laser scratches of the X number of first laser cutting lines on the side surface of the substrate 110 is more than twice of the sum of the areas of the elongated strip laser scratches of the Y number of second laser cutting line on the side surface of the substrate 110. According to the foregoing analysis, the quasi-circular laser explosion points contribute to the light emission, and in this embodiment, the proportion of the quasi-circular laser scratches is further increased and thus the light emission can be further increased, which is beneficial to improving the brightness.

What is claimed is:

1. An ultraviolet light emitting diode, comprising: a substrate and a semiconductor stacked layer disposed on a surface of the substrate;

wherein the semiconductor stacked layer has a lower surface facing towards the surface of the substrate and an upper surface opposite to the lower surface; the semiconductor stacked layer comprises a first semiconductor layer, a light emitting layer and a second semiconductor layer arranged sequentially in that order in a direction from the lower surface to the upper surface; at least one first laser cutting line formed by a first laser beam and at least one second laser cutting line formed by a second laser beam are disposed in the substrate; and one first laser cutting line of the at least one first laser cutting line is closer to the lower surface of the semiconductor stacked layer than each of the at least one second laser cutting line, and laser scratches of each of the at least one first laser cutting line are quasi-circular.

2. The ultraviolet light emitting diode as claimed in claim 1, wherein the at least one first laser cutting line is X in number, the at least one second laser cutting line is Y in number, X is greater than or equal to 2, and Y is greater than or equal to 1.

3. The ultraviolet light emitting diode as claimed in claim 1, wherein a spacing between each of the at least one first laser cutting line and the lower surface of the semiconductor stacked layer is greater than or equal to 30 micrometers (μm), and less than or equal to 130 μm.

4. The ultraviolet light emitting diode as claimed in claim 1, wherein a spacing between each of the at least one second laser cutting line and the lower surface of the semiconductor stacked layer is greater than or equal to 100 μm, and less than or equal to 210 μm.

5. The ultraviolet light emitting diode as claimed in claim 1, wherein the laser scratches of each of the at least one first laser cutting line are separated from each other, the laser scratches of each of the at least one first laser cutting line are uniformly distributed in a horizontal direction of the substrate, and a spacing between each two adjacent laser scratches of the laser scratches of each of the at least one first laser cutting line in the horizontal direction of the substrate is in a range from 1 μm to 16 μm.

6. The ultraviolet light emitting diode as claimed in claim 1, wherein laser scratches of each of the at least one second laser cutting line are uniformly distributed in a horizontal direction of the substrate, and a spacing between each two adjacent laser scratches of the laser scratches of each of the at least one second laser cutting line in the horizontal direction of the substrate is in a range from 2 μm to 18 μm.

7. The ultraviolet light emitting diode as claimed in claim 1, wherein the at least one first laser cutting line comprises at least three first laser cutting lines arranged in parallel, and spacings among the at least three first laser cutting lines in a vertical direction of the substrate are uniformly arranged.

8. The ultraviolet light emitting diode as claimed in claim 1, wherein the at least one first laser cutting line comprises at least three first laser cutting lines arranged in parallel, and spacings among the at least three first laser cutting lines in a vertical direction of the substrate are gradually changed.

9. The ultraviolet light emitting diode as claimed in claim 8, wherein in a direction facing away from the lower surface of the semiconductor stacked layer, a spacing between each two adjacent first laser cutting lines of the at least three first laser cutting lines in the vertical direction of the substrate gradually increases.

10. The ultraviolet light emitting diode as claimed in claim 8, wherein a spacing between each two adjacent first laser cutting lines of the at least three first laser cutting lines is in a range from 5 μm to 25 μm.

11. The ultraviolet light emitting diode as claimed in claim 1, wherein the at least one second laser cutting line comprises at least two second laser cutting lines arranged in parallel, and a spacing of each two adjacent second laser cutting lines of the at least two second laser cutting lines in a vertical direction of the substrate is in a range from 35 μm to 100 μm.

12. The ultraviolet light emitting diode as claimed in claim 1, wherein a thickness of the substrate is greater than or equal to 270 μm.

13. The ultraviolet light emitting diode as claimed in claim 1, wherein laser scratches of each of the at least one second laser cutting line are elongated strips in shape.

14. The ultraviolet light emitting diode as claimed in claim 13, wherein a sum of areas of the laser scratches of the at least one first laser cutting line on a side surface of the substrate and areas of laser scratches of the at least one second laser cutting line on the side surface of the substrate is more than 20% of an area of the side surface of the substrate.

15. The ultraviolet light emitting diode as claimed in claim 2, wherein X is greater than or equal to 3, and less than or equal to 5, and one of the Y number of second laser cutting line is arranged among the X number of first laser cutting lines in a vertical direction of the substrate.

16. The ultraviolet light emitting diode as claimed in claim 1, wherein each of the at least one first laser cutting line or the at least one second laser cutting line comprises a plurality of first cutting lines and a plurality of second cutting lines, and each of the plurality of first cutting lines and each of the plurality of second cutting lines are substantially perpendicular to each other.

17. The ultraviolet light emitting diode as claimed in claim 1, wherein a sum of areas of laser scratches of the at least one first laser cutting line on a side surface of the substrate is more than twice of a sum of areas of laser scratches of the at least one second laser cutting line on the side surface of the substrate.

18. The ultraviolet light emitting diode as claimed in claim 1, wherein each of the quasi-circular laser scratches has a longer axis and a shorter axis, and a ratio of the shorter axis to the longer axis is less than or equal to 1:1.5.

19. An ultraviolet light emitting diode, comprising a substrate and a semiconductor stacked layer disposed on the substrate;

wherein the semiconductor stacked layer comprises a first semiconductor layer facing towards the substrate, a light emitting layer arranged on a side of the first semiconductor layer facing away from the substrate, and a second semiconductor layer arranged on a side of the light emitting layer facing away from the first semiconductor layer;

wherein at least one first laser cutting line and at least one second laser cutting line are disposed in the substrate, each of the at least one first laser cutting line is closer to the first semiconductor layer relative to each of the at least one second laser cutting line, and laser scratches of the at least one first laser cutting line are quasi-circular scratches, each of the quasi-circular scratches has a longer axis and a shorter axis, and a ratio of the shorter axis to the longer axis is less than or equal to 1:1.5;

wherein laser scratches of the at least one second laser cutting line are strip-shaped scratches, and a spacing between each of the at least one first laser cutting line and a surface of the semiconductor stacked layer facing towards the substrate is greater than or equal to 30 µm.

20. An ultraviolet light emitting device, comprising the ultraviolet light emitting diode as claimed in claim 1.

\* \* \* \* \*